(12) United States Patent
Segalman et al.

(10) Patent No.: US 9,076,719 B2
(45) Date of Patent: Jul. 7, 2015

(54) DOPING OF A SUBSTRATE VIA A DOPANT CONTAINING POLYMER FILM

(71) Applicants: THE REGENTS OF THE UNIVERSITY OF CALIFORNIA, Oakland, CA (US); Rohm and Haas Electronic Materials LLC, Marlborough, MA (US)

(72) Inventors: Rachel A. Segalman, Pleasanton, CA (US); Megan L. Hoarfrost, Minneapolis, MN (US); Ali Javey, Emeryville, CA (US); Kuniharu Takei, Osaka (JP); Peter Trefonas, III, Medway, MA (US)

(73) Assignees: THE REGENTS OF THE UNIVERSITY OF CALIFORNIA, Oakland, CA (US); ROHM AND HAAS ELECTRONICS MATERIALS LLC, Marlborough, MA (US)

(*) Notice: Subject to any disclaimer, the term of this patent is extended or adjusted under 35 U.S.C. 154(b) by 15 days.

(21) Appl. No.: 13/972,307

(22) Filed: Aug. 21, 2013

(65) Prior Publication Data

US 2015/0056793 A1 Feb. 26, 2015

(51) Int. Cl.
| H01L 21/38 | (2006.01) |
| H01L 21/22 | (2006.01) |
| H01L 21/225 | (2006.01) |
| H01L 21/04 | (2006.01) |
| H01L 21/385 | (2006.01) |

(52) U.S. Cl.
CPC .......... *H01L 21/2254* (2013.01); *H01L 21/225* (2013.01); *H01L 21/0455* (2013.01); *H01L 21/2225* (2013.01); *H01L 21/385* (2013.01)

(58) Field of Classification Search
None
See application file for complete search history.

(56) References Cited

U.S. PATENT DOCUMENTS

| 4,578,283 A | 3/1986 | Kirtley et al. |
| 4,619,719 A * | 10/1986 | Thomas et al. ............... 438/562 |

(Continued)

FOREIGN PATENT DOCUMENTS

| EP | 0104412 A1 | 4/1984 |
| EP | 0165507 A2 | 12/1985 |
| JP | 2005123431 A | 5/2005 |

OTHER PUBLICATIONS

Hazut et al., "Contact Doping of Silicon Wafers and Nanostructures with Phosphine Oxide Monolayers", American Chemical Society, NANO vol. 6, No. 11, pp. 10311-10318, Oct. 22, 2012.

(Continued)

*Primary Examiner* — Brett Feeney
*Assistant Examiner* — Khanh Duong
(74) *Attorney, Agent, or Firm* — Cantor Colburn LLP

(57) ABSTRACT

Disclosed herein is a method for doping a substrate, comprising disposing a coating of a composition comprising a dopant-containing polymer and a non-polar solvent on a substrate; and annealing the substrate at a temperature of 750 to 1300° C. for 1 second to 24 hours to diffuse the dopant into the substrate; wherein the dopant-containing polymer is a polymer having a covalently bound dopant atom; wherein the dopant-containing polymer is free of nitrogen and silicon; and wherein the method is free of a step of forming an oxide capping layer over the coating prior to the annealing step.

9 Claims, 7 Drawing Sheets

(56) References Cited

U.S. PATENT DOCUMENTS

| | | | |
|---|---|---|---|
| 4,663,414 A | | 5/1987 | Estes et al. |
| 5,270,248 A | * | 12/1993 | Rosenblum et al. ............ 438/61 |
| 6,695,903 B1 | | 2/2004 | Kubelbeck et al. |
| 7,767,520 B2 | * | 8/2010 | Kamath et al. ................ 438/249 |
| 8,304,780 B2 | * | 11/2012 | Kamath et al. .................. 257/66 |
| 8,354,333 B2 | | 1/2013 | Afzali-Ardakani et al. |
| 2012/0018702 A1 | | 1/2012 | Javey et al. |

OTHER PUBLICATIONS

Ho, et al., "Wafer-Scale, Sub-5 nm Junction Formation by Monolayer Doping and Conventional Spike Annealing"; Nano Letters, vol. 9, No. 2, pp. 725-730 (2009).

Ho et al., "Controlled nanoscale doping of semiconductors via molecular monolayers." nature materials, vol. 7, pp. 62-67, Jan. 2008.

* cited by examiner

DOPING OF A SUBSTRATE VIA A DOPANT CONTAINING POLYMER FILM

BACKGROUND

This disclosure relates to the doping of a substrate via a dopant containing polymer film that is disposed upon the substrate.

One of the challenges of scaling electronic devices down to the nanometer regime (sizes less than 100 nanometers (nm)) is achieving controlled doping of semiconductor materials in the sub-10 nanometer size range. For example, with transistor gate lengths fast approaching sub-10 nm size range, highly conductive ultra-shallow junctions on the nanometer length scale are used to scale down transistor size to achieve faster transistor speeds and higher packing densities. Furthermore, a wide range of proposed miniaturized electronic applications incorporate nanowire building blocks or other non-planar conductive nanostructures that use doping.

Current methods are not suitable for doping to depths of less than 10 nm. Ion implantation involves the bombardment of silicon substrates with high-energy dopant ions that replace silicon atoms in the substrate lattice. However, the process also produces point defects and vacancies in the lattice, which interact with the dopants to broaden the junction profile, thereby limiting the formation of sub-10 nm doping profiles. Furthermore, ion implantation is incompatible with non-planar, nanostructured materials because the energetic ions have a significant probability of penetrating completely through the nanostructure without remaining in the lattice while causing significant crystal damage. On the other hand, conventional solid-source diffusion procedures lack control and uniformity when doping is to be conducted at depths of less than 10 nm.

Monolayer doping procedures overcome the difficulties of current technologies and achieve high-quality, sub-5 nm doping profiles with high areal uniformity. During this procedure, a highly uniform, covalently bonded monolayer of dopant-containing small molecules is formed on silicon surfaces. In a subsequent thermal annealing step, the dopant atoms are diffused into the silicon lattice. This approach has resulted in the demonstration of the shallowest junctions reported to date with low sheet resistivity for both p- and n-type doping, and is compatible with non-planar, restricted-dimension nanostructured substrates. However, the monolayer doping strategy uses a couple of steps that are cumbersome. Firstly, deposition of the dopant containing small molecules is carried out in an oxygen free atmosphere (i.e., in an inert atmosphere or in a vacuum) to prevent oxidative contamination. In addition, a silicon oxide capping layer is evaporated on top of the surface-functionalized silicon substrate before the annealing step in order to achieve efficient diffusion of the dopant atoms into the silicon substrate. The evaporation of the capping layer requires high vacuum of approximately ~$10^{-6}$ Torr.

Japanese Pat. App. JP 2005-123431 discloses forming an n-type diffusion zone by coating a film of an acidic organic phosphoric acid ester polymers (degree of polymerization of 500 or lower) dissolved in a polar organic solvent or water or a mixture thereof on a substrate followed by heating for a period of time at a first temperature that is lower than the diffusion temperature of phosphorus, then heating for a period of time in an oxidizing atmosphere at a second temperature that is higher than the first temperature but lower than the diffusion temperature of phosphorus, followed by heating for a period of time, such as 10 hours, in a non-oxidizing atmosphere at a third temperature that is higher than the second temperature in order to diffuse phosphorus into the substrate. This is a complex approach, necessitating three different heating cycles, and switching atmospheres between cycles. Also, the use of such polar solvents is often incompatible with standard processes used in semiconductor manufacture, possibly leading to poor film coating. If such a film is coated incompletely on the substrate, then the substrate will likely have a non-uniform doping of phosphorus.

Accordingly, it is desirable to develop a process for doping a substrate in ambient conditions without using a high vacuum and without using etching.

SUMMARY

Disclosed herein is a method for doping a substrate, comprising disposing a coating of a composition comprising a dopant-containing polymer and a non-polar solvent on a substrate; and annealing the substrate at a temperature of 750 to 1300° C. for 1 second to 24 hours to diffuse the dopant into the substrate; wherein the dopant-containing polymer is a polymer having a covalently bound dopant atom; wherein the dopant-containing polymer is free of nitrogen and silicon; and wherein the method is free of a step of forming an oxide capping layer over the coating prior to the annealing step.

BRIEF DESCRIPTION OF THE FIGURES

(FIG. 2B). The thickness of the polymer films before annealing was 16 nm. The control experiment was performed using a silicon substrate without a polymer film that underwent the rapid thermal annealing procedure;

DETAILED DESCRIPTION

Figure 1A:
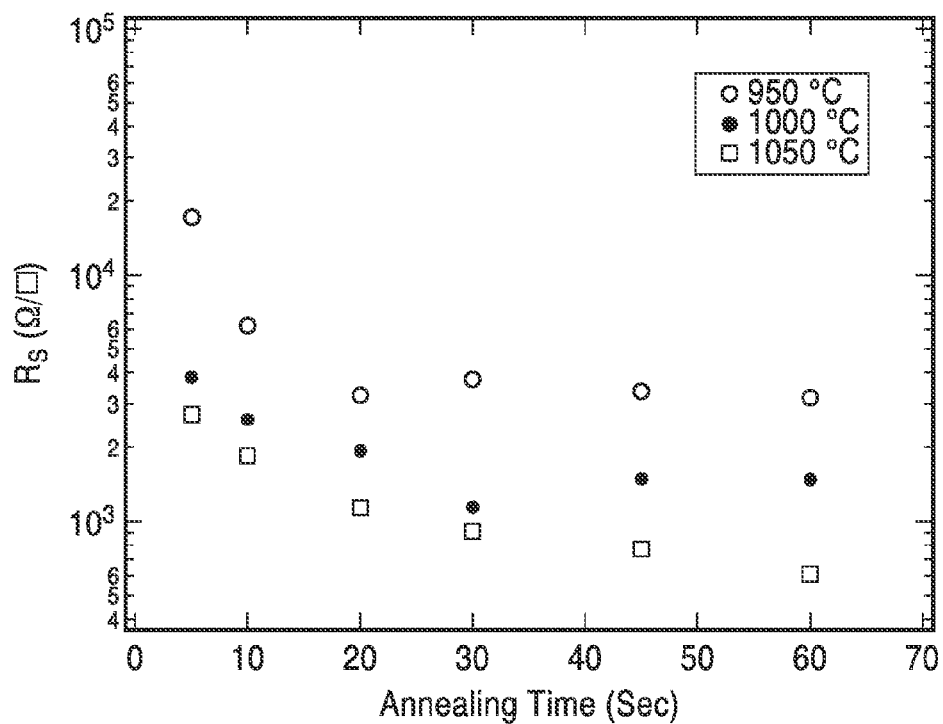
FIG. 1A and FIG. 1B are plots of sheet resistance, $R_S$, for p-type (boron) (FIG. 1A) and n-type (phosphorus) (FIG. 1B) doped silicon substrates as a function of annealing time and temperature.

The transition term "comprising" is inclusive of the transition terms "consisting of" and "consisting essentially of". The term "and/or" is used herein to mean both "and" as well as "or". For example, "A and/or B" is construed to mean A, B or A and B.

Disclosed herein is a method for achieving a doping a semiconducting substrate by coating the substrate with a dopant containing polymer film and annealing the substrate at an elevated temperature. The polymer film comprises a polymer that contains the dopant. The dopant is covalently bonded to the polymer. Heating the substrate promotes diffusion of the dopant from the polymer to the substrate. This method is advantageous in that a vacuum is not desirable during the process. The polymer film acts as its own capping layer thereby eliminating the need for using a capping layer that is used in other commercially available comparative processes. In other words, the method is free of a step of forming an oxide capping layer over the polymer film prior to the annealing step. By using low annealing temperatures and low annealing times, doped junctions as shallow as 5 nanometers can be obtained in the substrate. The method is particularly beneficial, for example, for forming highly conductive ultrashallow junctions for source/drain transistor gates and for doping silicon nanostructures such as nanowires to produce a variety of miniaturized electronic devices. The polymer film is also referred to herein as a polymer coating or a polymer layer.

The substrate is a semiconducting substrate. Examples of suitable semiconducting substrates are amorphous silicon, gallium arsenide, silicon germanium, silicon carbide, mixtures of arsenic, selenium and tellurium, and the like. An exemplary semiconductor for use as the substrate is silicon.

The substrate is coated with a polymeric film that contains the dopant with which the substrate is doped. Dopants may include boron, phosphorus, arsenic, bismuth, antimony, gallium, or combinations thereof. The dopant is covalently bonded to the polymer and will hereinafter be termed a dopant containing polymer. In an embodiment, the dopant is part of the polymer backbone, while in another embodiment the dopant is a substituent on the polymer backbone. In yet another embodiment, the dopant is part of the polymer backbone as well as a substituent on the polymer backbone. In a preferred embodiment, the dopant is either phosphorus or boron and polymers containing these dopants will hereinafter be referred to as boron containing polymers or phosphorus containing polymers.

The dopant containing polymer can be a thermoplastic polymer, a blend of thermoplastic polymers, a thermosetting polymer, or a blend of thermoplastic polymers with thermosetting polymers. The dopant containing polymer may also be a blend of dopant containing polymers, dopant containing copolymers, dopant containing terpolymers, or combinations comprising at least one of the foregoing polymers. The dopant containing polymer can also be an oligomer, a homopolymer, or a copolymer which may be alternating, block, random or graft. The dopant containing polymers may be linear, dendritic, star, branched or cyclic, or the like. In an embodiment, the thermosetting film (containing the dopant) may be applied to the substrate as a thermoplastic film and can undergo crosslinking (i.e., become a thermoset) during the annealing of the film.

Boron containing polymers can be those derived from the polymerization of organoboron complexes, by the incorporation of organoboron complexes or boron containing moieties into the backbone of a polymer or by the incorporation of organoboron complexes or boron containing moieties as substituents on a polymer backbone.

Examples of organoboron complexes that are used to derive the boron containing polymers are borane, vinylborane, vinyl boronic acids, borazine, vinylborazine, cyclodiborazane, boron quinolate, boron diketonate, pyrazabole, boron dipyrromethane, carborane, and the like. The aforementioned organoboron complexes may be substituted if desired. Examples of polymers that can be derived by polymerization of the aforementioned organoboron complexes are poly[2-(vinyl)pentaborane)], polyvinylborazine, polyborazylene, poly(cyclodiborazane), cyclodiborazane-containing polymers, boron quinolate polymers, pyrazabole containing polymers, carborane containing polymers, poly(vinylboronic acid), or the like, or a combination comprising at least one of the foregoing polymers. The polymers can be substituted if desired.

A preferred boron containing polymer is poly(vinylboronic acid). A preferred substituted boron containing polymer is poly(vinylboronic acid pinacol ester).

Phosphorus containing polymers include phosphazene polymers, phosphate polymers, phosphoric acid polymers, phosphonic acid polymers (e.g., poly(vinylidene-1,1-diphosphonic acid), or the like, or a combination comprising at least one of the foregoing polymers.

The phosphazene polymers have a —P=N— bond in the molecule. Phosphazene polymers may be cyclic polymers as represented by the formula (1) below, or linear polymers as represented by the formula (2) below; and a crosslinked phenoxyphosphazene compound obtained by crosslinking at least one species of phenoxyphosphazene selected from those represented by the formulae (1) and (2) below, with a crosslinking group represented by the formula (1) below:

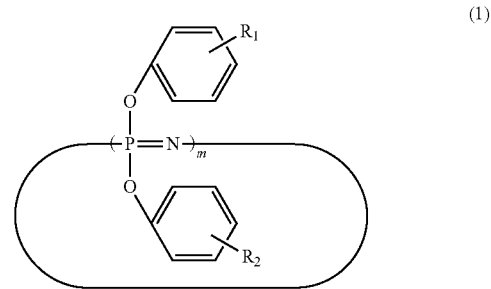

(1)

where in the formula (1), m represents an integer of 3 to 25, $R_1$ and $R_2$ are the same or different and are independently a hydrogen, a hydroxyl, a $C_{7\text{-}30}$ aryl group, a $C_{1\text{-}12}$ alkoxy, or a $C_{1\text{-}12}$ alkyl.

The chainlike phenoxyphosphazene represented by the formula (2) below:

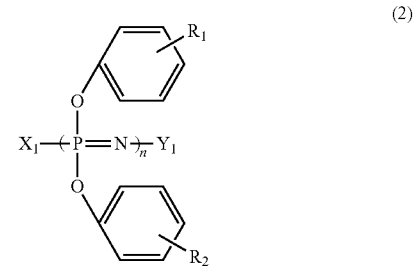

(2)

where in the formula (2), $X^1$ represents a —N=P(OPh)$_3$ group or a —N=P(O)OPh group, $Y^1$ represents a —P(OPh)$_4$ group or a —P(O) (OPh)$_2$ group, n represents an integer from 3 to 10000, Ph represents a phenyl group, $R_1$ and $R_2$ are the same or different and are independently a hydrogen, a halogen, a $C_{1\text{-}12}$ alkoxy, or a $C_{1\text{-}12}$ alkyl.

The phenoxyphosphazenes may also have a crosslinking group represented by the formula (3) below:

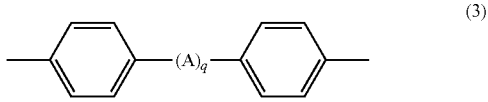
(3)

where in the formula (18), A represents —C(CH3)$_2$—, —SO$_2$—, —S—, or —O—, and q is 0 or 1.

In an embodiment, phosphoric acid polymers have the structure of formula (4)

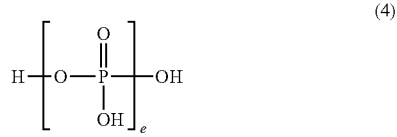
(4)

wherein e is an integer between 1 and 500.

It is desirable for the dopant containing polymer to be free of nitrogen and silicon. When the dopant containing polymer is a homopolymer, it is preferred that it comprises as polymerized units a monomer that is free of hydroxyl, amine, amido, thiol, and carboxylic acid groups. When the dopant-containing polymer is a copolymer, it is preferred that it comprises as polymerized units <50 wt % of any monomers comprising a substituent chosen from hydroxyl, amine, amido, thiol, carboxylic acid, and combinations thereof.

An example of a phosphonic acid polymer is poly(vinylidene-1,1-di-phosphonic acid) or poly(diethyl vinylphosphonate). An exemplary phosphorus containing polymer is poly(diethyl vinylphosphonate).

The dopant containing polymers may be copolymerized with other non-dopant containing polymers or blended with other non-dopant containing polymers before being disposed on the substrate. In an embodiment, the dopant containing polymer may be copolymerized with a non-dopant containing polymer and then blended with additional non-dopant containing polymer. This copolymerization or blending facilitates solubilization of the dopant containing polymer in a solvent prior to being disposed upon the semiconducting substrate.

The non-dopant containing polymers can be thermoplastic polymers or thermosetting polymers. Examples of the thermoplastic polymers are polyacetals, polyolefins, polyacrylics, polystyrenes, polyarylsulfones, polyethersulfones, polyphenylene sulfides, polyvinyl chlorides, polysulfones, polytetrafluoroethylenes, polyetherketones, polyether etherketones, polyether ketone ketones, polyphthalides, polyacetals, polyanhydrides, polyvinyl ethers, polyvinyl thioethers, polyvinyl alcohols, polyvinyl ketones, polyvinyl halides, polyvinyl esters, polysulfonates, polysulfides, polythioesters, polysulfones, polyethylene terephthalate, polybutylene terephthalate, ethylene propylene diene rubber, polytetrafluoroethylene, fluorinated ethylene propylene, perfluoroalkoxyethylene, polychlorotrifluoroethylene, polyvinylidene fluoride, or the like, or a combination comprising at least one of the foregoing thermoplastic polymers.

Examples of thermosetting polymers include epoxy polymers, vinyl polymers, benzocyclobutene polymers, acrylics, alkyds, phenol-formaldehyde polymers, novolacs, resoles, hydroxymethylfurans, diallyl phthalate, or the like, or a combination comprising at least one of the foregoing thermosetting polymers.

In one embodiment, the weight fraction and the block length of the non-dopant containing polymer can be varied in order to vary the amount of dopant and the concentration of dopant delivered on a particular portion of the substrate. When the dopant containing polymer is copolymerized and/or blended with another non-dopant containing polymer, it is generally present in an amount of 20 to 95 weight percent (wt %), preferably 35 to 85 wt %, and more preferably 45 to 75 wt %, based on the total weight of the copolymer and/or the blend.

In one embodiment, in one method of doping the semiconducting substrate, the polymer is solubilized in a solvent and disposed on the substrate. The substrate with the polymer disposed thereon is then subjected to annealing (also termed heating) to remove the solvent and to facilitate the doping of the semiconducting substrate.

The solvent is preferably a non-polar solvent. The dipole moment or dielectric constant is used to characterize the polarity of solvents and solvents with a dielectric constant of less than 17.5, preferably less than 10, and more preferably less than 5 are generally considered to be nonpolar. Exemplary non-polar solvents include, without limitation: aromatic hydrocarbons; esters; ethers; and the like. Examples of polar solvents are pentane, cyclopentene, hexane, cyclohexane, benzene, toluene, 1,4-dioxane, chloroform, tetrahydrofuran, diethyl ether, xylene, mesitylene, propylene glycol methyl ether acetate, n-butyl acetate, or the like, or a combination comprising at least one of the foregoing. An exemplary non-polar solvent is tetrahydrofuran.

When the dopant containing polymer is mixed with the non-polar solvent, the polymer is present in an amount of 0.0005 to 5 wt %, based on the total weight of the solvent and the dopant containing polymer. In a preferred embodiment, the polymer is present in an amount of 0.001 to 0.02 wt %, based on the total weight of the solvent and the dopant containing polymer.

The dopant containing polymer-non-polar solvent solution (hereinafter polymer-solvent solution) may be subjected to agitation and to an increased temperature in order to facilitate solvation of the polymer. The polymer-solvent solution is then disposed upon the substrate surface. The substrate surface may be pre-cleaned by heating or by washing in a solvent prior to disposing the polymer-solvent solution on it.

The polymer-solvent solution may be disposed on the substrate by spin coating, doctor blading, spray coating, dip coating, screen printing, brush coating, and the like. A preferred method for coating the substrate is via spin coating. The solvent can be evaporated from the substrate surface leaving a polymer coating disposed on the substrate. The polymer coating contains the dopant.

The polymer coating acts as its own capping layer, eliminating the need for the high-vacuum evaporation of a metal-oxide layer, such as a silica layer, that is generally used in existing monolayer doping procedures. Furthermore, because the semiconductor substrate is coated with the polymer film rather than being covalently attached, the need for a non-oxidative ambient condition is also eliminated.

The thickness of the polymer coating may range from a few nanometers to a few hundred nanometers (nm), preferably 3 to 250 nm, and more preferably 5 to 200 nm and even more preferably 6 and 120 nm. However, it is contemplated that thinner films could be used, so long as care is taken to avoid pinholes, which would lead to non-uniform doping. Thicker films may also be used if desired if care is taken to minimize the presence of increased organic residue on the semiconductor substrate after annealing.

The substrate along with the polymer coating disposed thereon is then subjected to annealing to a temperature of 500 to 1500° C., preferably 700 to 1300° C. for a period of 2 seconds to 24 hours, preferably for 4 seconds to 12 hours, and more preferably for 10 seconds to 3 minutes. Annealing may be conducted by using heating convection, conduction or radiation heating. Convective heating is preferred during the annealing process.

The annealing may be conducted in a vacuum or alternatively in an inert atmosphere. Suitable inert atmospheres include nitrogen, argon, zeon, helium, nitrogen or carbon dioxide. In a preferred embodiment, the annealing is conducted in an inert atmosphere that contains nitrogen.

The resulting dopant concentration profile within the substrate is a function of the annealing temperature and time for which the substrate and the polymer coating is subjected to diffusion. Other influential factors are the solubility of the dopant molecule in semiconductor substrate at the annealing temperature and the diffusion coefficient of the dopant molecule at the annealing temperature. The annealing time and temperature could thus be varied as needed to achieve the desired dopant profile. Thus, doped junctions as shallow as sub-5 nm may be obtained using appropriately low annealing temperatures and short annealing times.

During the annealing, the any residual solvent from the polymer coating evaporates, leaving behind only the polymer. The dopant from the dopant containing polymer diffuses into the substrate to a depth of 0.01 to 1000 nm, preferably 0.05 to 100 nm, preferably 0.09 to 50 nm and more preferably 0.1 to 10 nm.

This method of doping facilitates the formation of junctions for source and drain extension regions in electronic devices and articles such as transistors with fast switching speeds and high packing densities. Additional applications include, but are not limited to, transistor gates, nanostructures, diodes, photodetectors, photocells, and integrated circuits.

The method of doping detailed herein is exemplified by the following non-limiting examples.

EXAMPLES

Example 1

This example demonstrates the manufacturing of the boron containing polymer. The boron containing polymer, poly(vinylboronic acid pinacol ester) (PVBAPE), is synthesized as follows. Vinylboronic acid (2.5 g) was converted to the pinacol ester by stirring with a slight molar excess of pinacol (2.1 g) in dichloromethane (50 mL) for 24 hrs at room temperature over molecular sieves (1.0 g). The esterified monomer (1.0 g) was polymerized for 16 hours at 70° C. by reversible addition-fragmentation chain transfer polymerization, using 2-dodecylsulfanylthiocarbonylsulfanyl-2-methylpropionic acid as the chain transfer agent (0.0155 g), azobisisobutyronitrile (AIBN) as the initiator (0.0011 g), and anhydrous anisole as the solvent (1 mL). The resulting polymer was isolated by precipitation into cold (−20° C.) hexanes. The number-averaged molecular weight, $M_N$, and polydispersity were found to be 10 kg/mol and 1.28, respectively, using gel permeation chromatography (GPC) with polystyrene molecular weight standards. Initially, a series of polymers with a range of molecular weights were synthesized. PVBAPE having a number average molecular weight $M_n$=10 kg/mol was used for all the doping tests detailed herein.

Example 2

This example demonstrates the manufacturing of the phosphorus containing polymer. The phosphorus containing polymer, poly(diethyl vinylphosphonate) (PDEVP) was synthesized via anionic polymerization of diethyl vinylphosphonate (DEVP). DEVP (6.0 mL) and diphenylethylene (DPE, 0.5 mL) were degassed using three freeze-pump-thaw cycles, dried by stirring overnight over molecular sieves or calcium hydride, respectively, and distilled into flame-dried ampules. Anhydrous tetrahydrofuran (THF, 125 mL) was degassed and cleaned with sec-butyl lithium (300 µL) at −78° C. for 30 min (and was then warmed to room temperature overnight). DPE was cannula-transferred into the THF at −78° C., and then initiated with sec-butyl lithium (150 µL, of 1.4 M solution in cyclohexane). After 30 minutes, DEVP was transferred to the reaction vessel and the polymerization was allowed to proceed for 3 hours before termination with methanol. The resulting polymer was precipitated into cold (0° C.) hexanes. The theoretical number average molecular weight was calculated to be 31 kg/mol based on the amount of monomer and initiator used. However, the actual molecular weight could not be determined by GPC due to the polymer sticking on the columns.

Example 3

This example demonstrates the disposing of the polymer film on the substrate and the doping of the substrate. Polymer films (either the PVBAPE or PDEVP) were spin-coated from dilute solution in toluene or chloroform onto high-resistivity (>10,000 ohm-cm) silicon substrates on the (100) plane. The silicon substrates were obtained from Silicon Valley Microelectronics; Santa Clara, Calif. The undoped silicon substrates were first treated with dilute HF 28 (~1%) to remove the native oxide layers. Concentrations ranging between 1 and 20 mg/mL, and a spin speed of 2000 revolutions per minute (rpm) were used to obtain thicknesses varying between 6 and 120 nm, which were determined by ellipsometry. The coated substrates with polymer films underwent rapid thermal annealing under a nitrogen gas purge using a Heatpulse 210T RTA system. The temperature was ramped from room temperature to either 950° C., 1000° C., or 1050° C. over the course of 20 seconds (sec), then held at the annealing temperature for either 10, 30, or 60 sec before cooling back to room temperature over the course of ~20 sec.

Example 4

Tests were then performed, which revealed that the polymer film doping method of the present invention produces highly p- or n-type doped substrates, as evidenced by four-point probe measurements of the resulting sheet resistance, $R_S$. For example, silicon substrates coated with a 17 nm thick film of the boron containing polymer and annealed at 1000° C. for 30 seconds have a $R_S$ of $2.2*10^3$ Ω/square (also shown as Ω/□ in the figures). Within error, this is the same as the $R_S$ of p-type doped substrates obtained using existing monolayer doping procedures with the same annealing temperature and time. Silicon substrates coated with a 18 nm thick film of the phosphorus containing polymer and annealed at 1000° C. for 30 seconds have a $R_S$ of $5.4*10^2$ Ω/square, which is higher, but on the same order of magnitude as that achieved by existing monolayer n-type doping procedures. It should be noted that the n-type doped substrates have lower sheet resistance for a given set of annealing conditions due to the higher solubility and diffusion coefficient of phosphorus in silicon compared to boron.

Figure 1B:
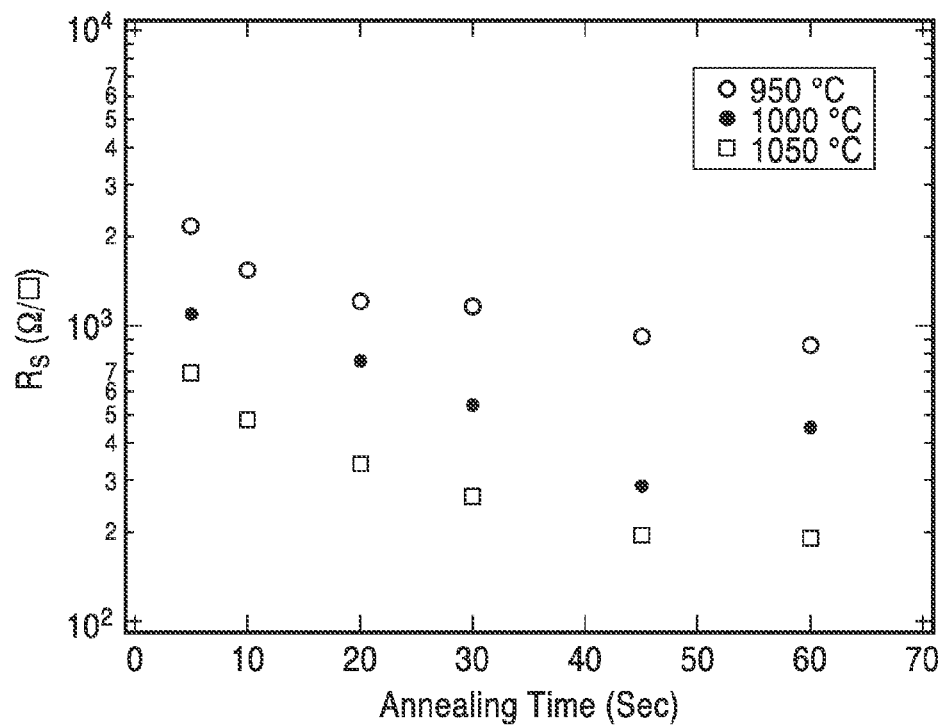

The dopant profiles in the silicon substrate can be controlled by tuning the annealing conditions. As shown in FIG. 1A and FIG. 1B, the sheet resistances of n-type and p-type doped silicon substrates decrease with increasing annealing time and temperature. The decrease with temperature is due to the increased solubility and diffusion of the dopant in silicon at elevated temperatures, while the decrease with time is due to the longer time available for dopant molecules to diffuse into the silicon substrate.

Figure 2A:
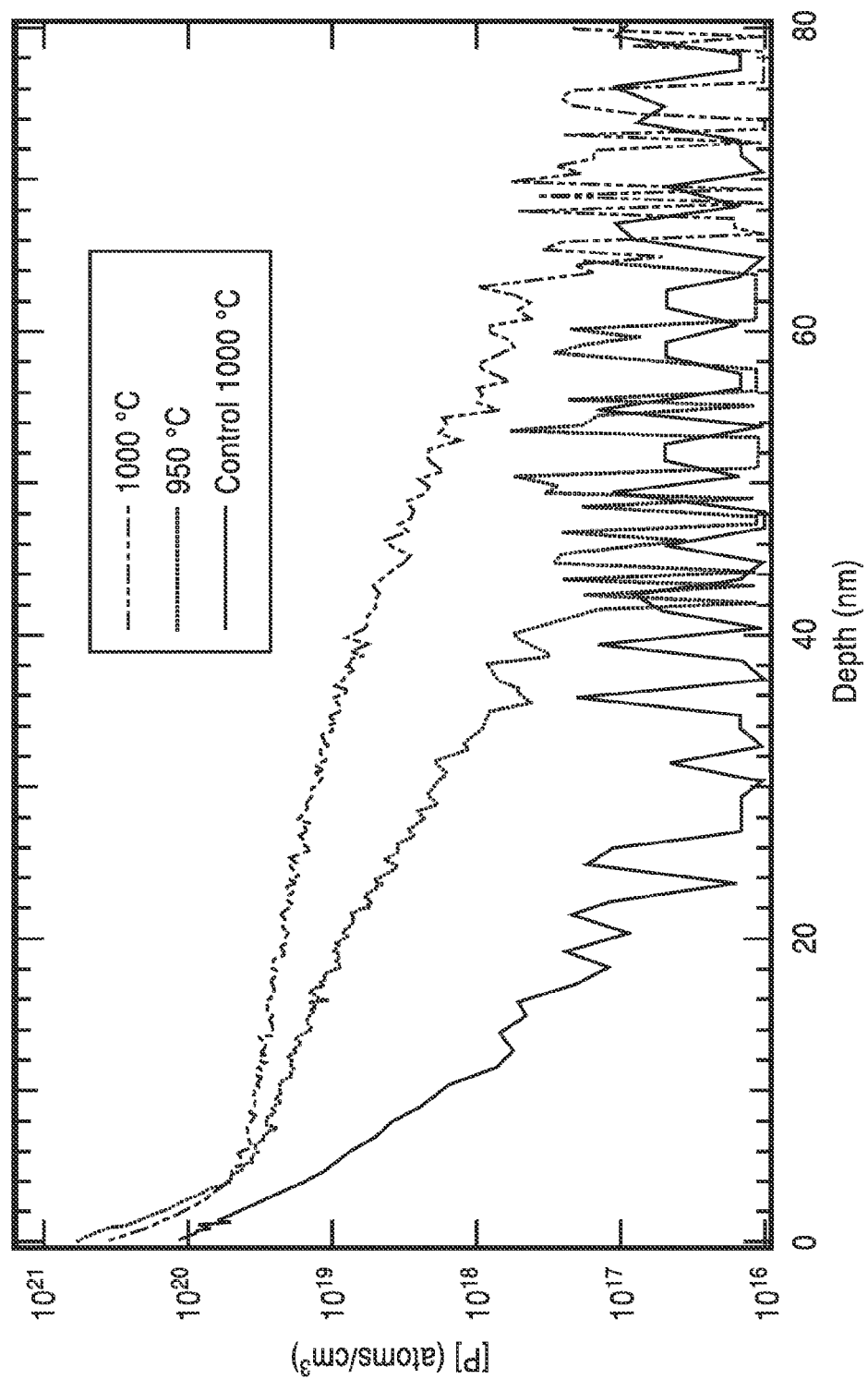
FIG. 2A and FIG. 2B are plots of depth profiles of phosphorus dopant atoms in silicon substrates as a function of annealing temperature, using a fixed annealing time of 30 sec (FIG. 2A) and as a function of annealing time, using a fixed annealing temperature of 1000° C.
Figure 2B:
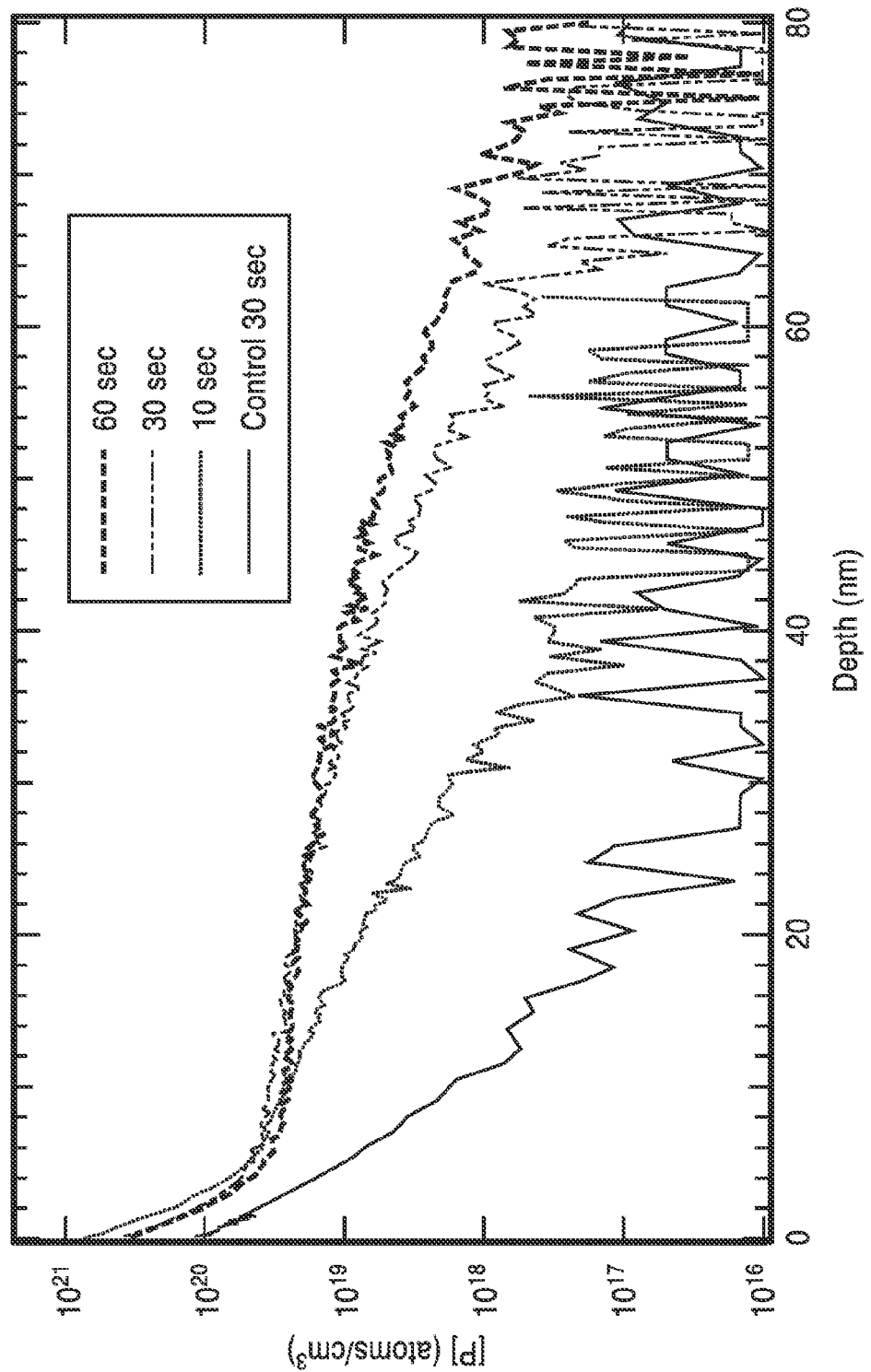

Secondary-ion mass spectrometry (SIMS) experiments that measured the depth profiles of the dopant atoms in the silicon substrate after doping confirm that there is a greater concentration of dopant atoms in the silicon substrate for higher annealing temperatures and longer annealing times (see FIG. 2A and FIG. 2B). They also show that the dopant atoms penetrate deeper into the silicon substrate due to enhanced diffusion and longer diffusion times. In the case of phosphorus-doped substrates, while the overall concentration of phosphorus increases for higher annealing temperatures and longer annealing times, the concentration of phosphorus at the surface actually decreases slightly (see FIG. 2A and FIG. 2B). In other words, during the rapid thermal annealing step, the polymer film does not supply sufficient phosphorus atoms to maintain the concentration of phosphorus just under the surface of the silicon substrate at the equilibrium phosphorus solubility. The surface concentrations measured in this work at 1000° C. range from $3*10^{20}$ to $8*10^{20}$ atoms/cm$^3$ depending on the annealing time, whereas the equilibrium solubility of phosphorus in silicon at 1000° C. has been previously measured to be $1*10^{21}$ atoms/cm$^3$.

Figure 3A:
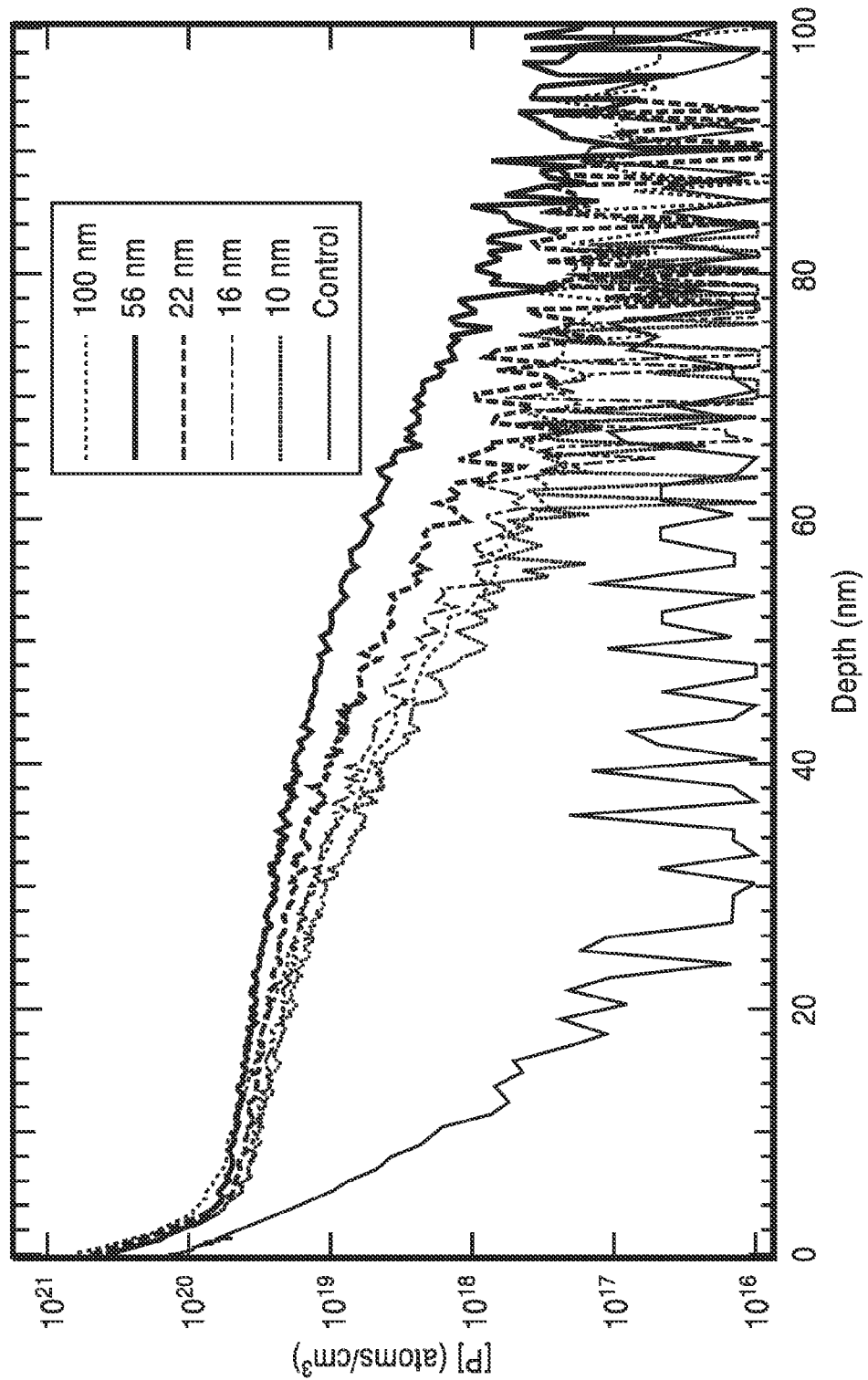
FIG. 3A and FIG. 3B are plots of depth profiles of phosphorus atoms in doped silicon substrates (FIG. 3A) and sheet resistances of boron- and phosphorus-doped silicon substrates (FIG. 3B) using polymer films of varying thickness. All substrates were annealed at 1000° C. for 30 sec.
Figure 3B:
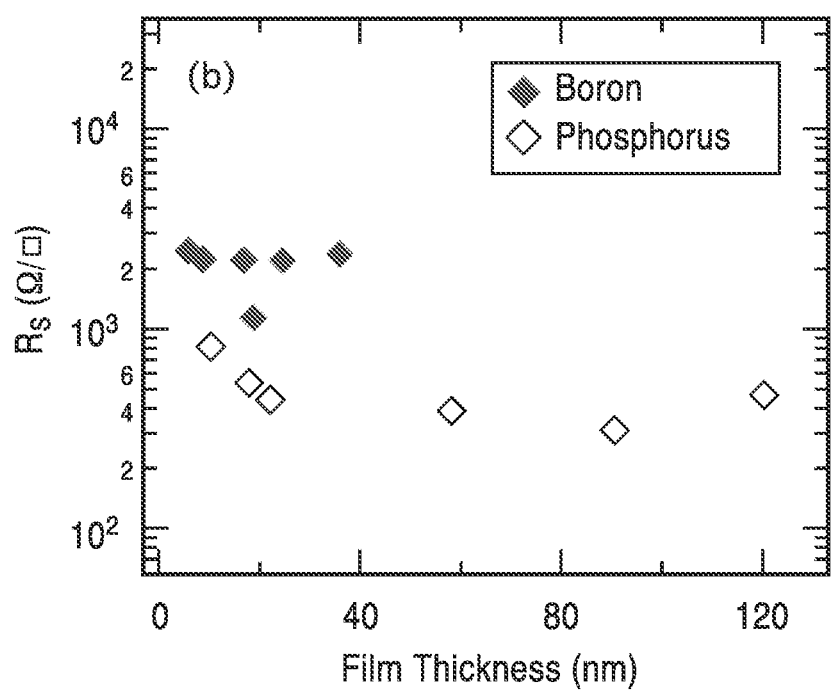

In order to increase the amount of phosphorus doping, we increased the phosphorus "source" by increasing the phosphorus film thickness. As shown in FIG. 3A and FIG. 3B, the amount of phosphorus incorporated into the silicon substrate indeed increases with increasing film thickness, and there is a corresponding decrease in the measured $R_S$. The $R_S$ seems to level off at about $3*10^2$ Ω/square for film thickness between about 40-90 nm, under which conditions the surface phosphorus concentration is still lower than the equilibrium solubility (and the $R_S$ is still about twice as high as that obtained using existing monolayer doping procedures).

Figure 4:
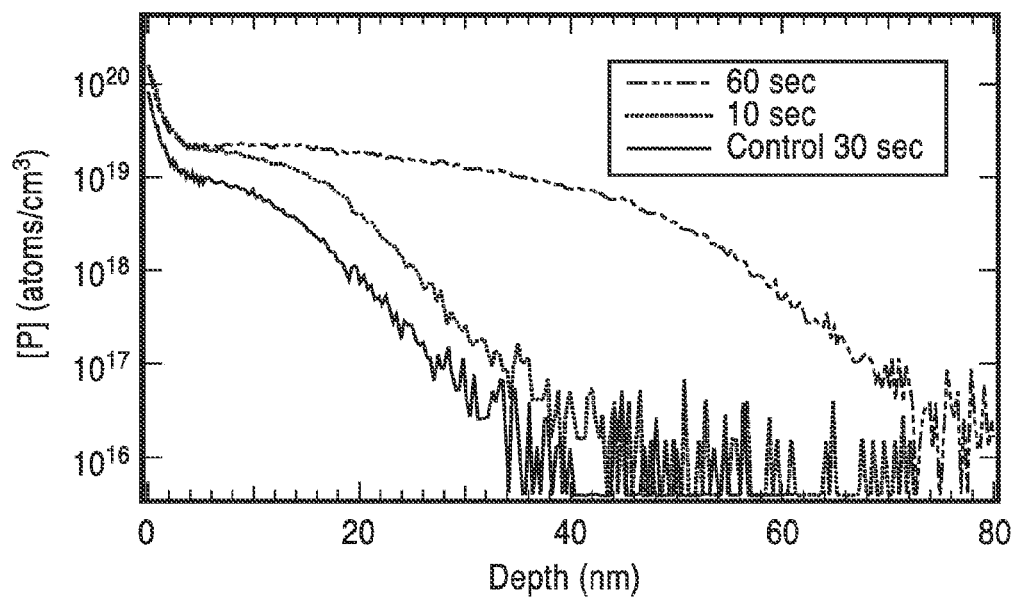
FIG. 4 is a plot of depth profiles of boron atoms in doped silicon substrates annealed at 1000° C. for various annealing times. The thickness of the polymer films before annealing was 20 nm.

Unlike phosphorus doping, boron doping is not dependent on the polymer film thickness (see FIG. 3B). Therefore, for the annealing temperatures and times probed in this study, boron doping can be described by a "constant source" diffusion model, meaning that even for the thinnest films, the polymer film supplies sufficient dopant atoms such that the concentration of boron atoms just under the surface of the silicon substrate is equal to the maximum solubility of boron in silicon. The dopant profile, then, depends only on the annealing time and temperature. As shown in FIG. 4, the concentration of boron right at the surface of doped silicon substrates is constant for various annealing times and is close to the equilibrium solubility of $2*10^{20}$ to $4*10^{20}$ atoms/cm$^3$, while the concentration of boron deeper into the silicon substrate increases for longer annealing times.

Figure 5:
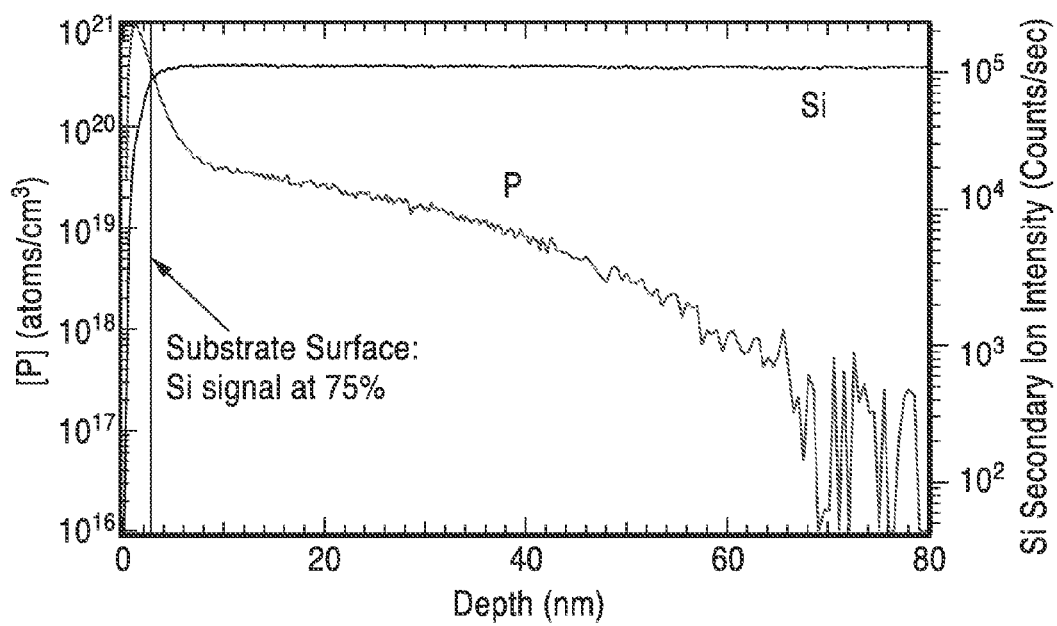
FIG. 5 shows phosphorus and silicon SIMS profiles doped silicon substrates annealed at 1000° C. for 30 sec, using a 16 nm phosphorus containing polymer film.

Polymer films with a higher phosphorus content may be used to improve phosphorus doping, along with different polymer chemistries to promote "self-capping." The surface of the substrate was determined by monitoring the secondary ion intensity for Si, which sharply increases at the surface of the silicon substrate, and then remains constant. The surface of the substrate was taken to be the point at which the secondary ion intensity for Si reached 75% of the plateau value. FIG. 5 shows phosphorus and silicon SIMS profiles doped silicon substrates annealed at 1000° C. for 30 sec, using a 16 nm phosphorus containing polymer film. The substrate surface was designated the depth at which the silicon signal reached 75% of its plateau value. The phosphorus signal at shallower depths is likely attributed to residual organic material on top of the substrate.

Figure 6A:
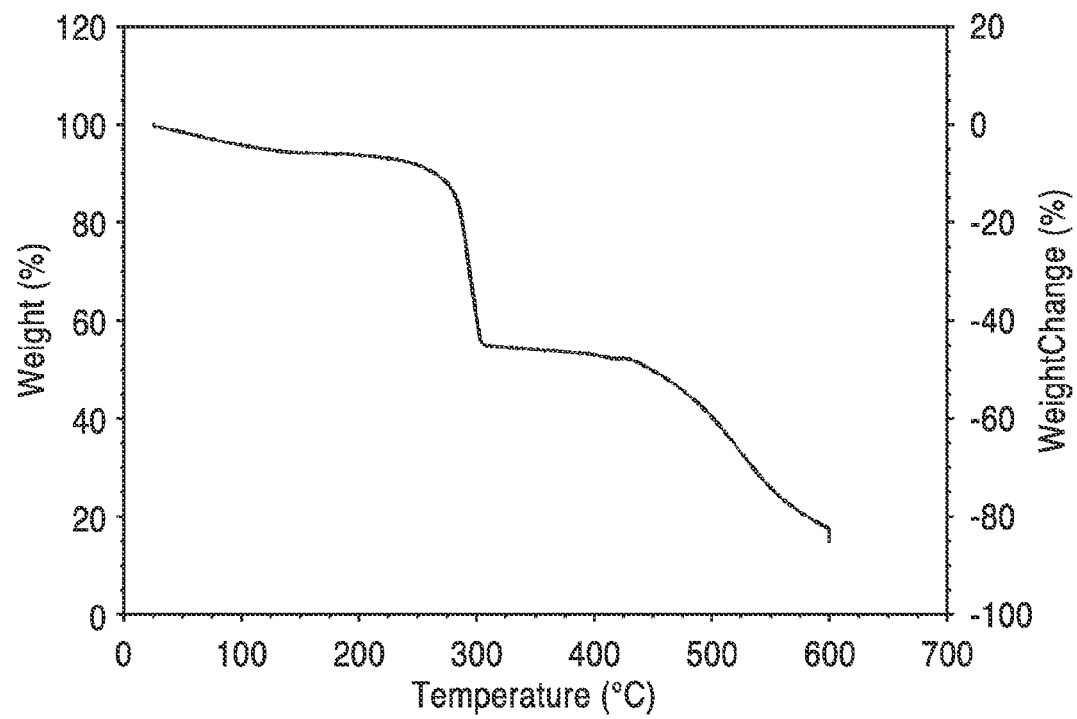
FIG. 6A and FIG. 6B show plots of the thermal gravimetric analysis results for the boron containing polymer (FIG. 6A) and the phosphorus containing polymer (FIG. 6B) of the present invention.
Figure 6B:
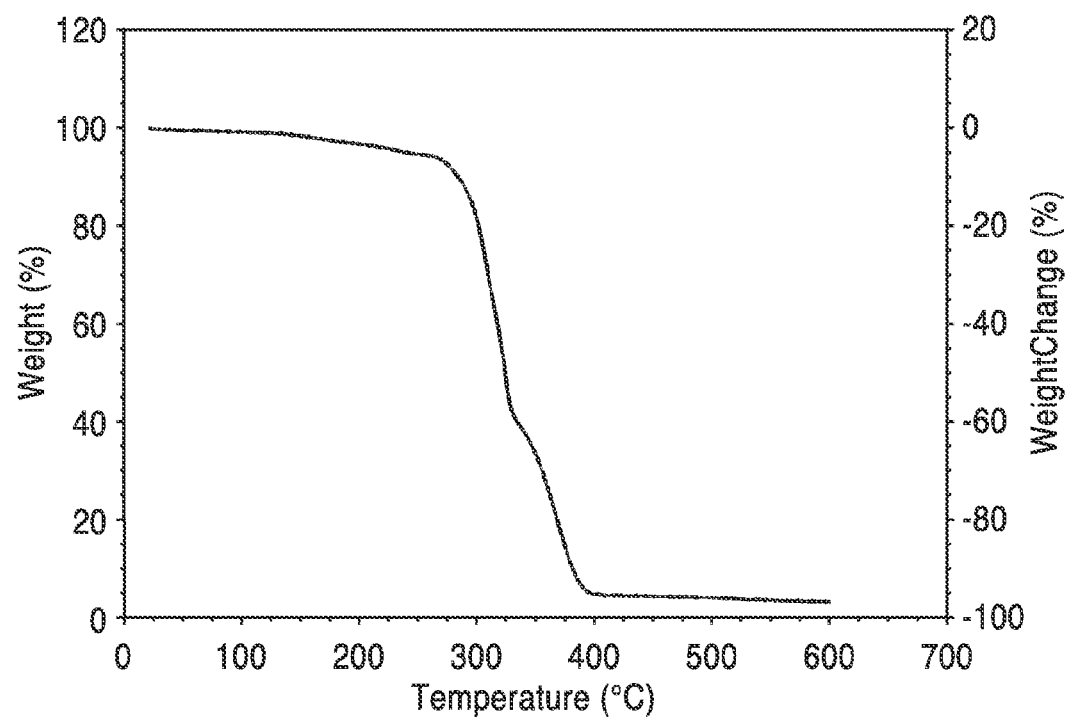

FIG. 6A and FIG. 6B show plots of the thermal gravimetric analysis results for the boron containing polymer (FIG. 6A) and the phosphorus containing polymer (FIG. 6B). The temperature was increased at a rate of 5° C./min. Both polymers degrade at similar temperatures. The two-step degradation method is attributed to the preliminary degradation of the side chains and secondary degradation of the main chain of the polymers The tests revealed that the carbon content of boron- and phosphorus-doped substrates of the present invention were not significantly different from a control substrate, which went through the rapid thermal annealing procedure, but did not have a polymer film deposited on it beforehand.

In summary, silicon doping using dopant-containing polymer thin films affords excellent nanoscale n-type and p-type doping that is unattainable by conventional methods, and improves upon advanced techniques, specifically monolayer doping, by eliminating the need for air-free chemistry and the high-vacuum deposition of a silicon oxide capping layer. This process is particularly useful, for example, for forming highly conductive ultra-shallow junctions for source/drain transistor gates or for doping silicon nanostructures such as nanowires for a variety of miniaturized electronic devices. While the doping profiles shown above generally have total depths of tens of nanometers, it is anticipated that the annealing conditions of the method of the present invention can be tuned to afford depth profiles of only a few nanometers.

What is claimed is:

1. A method for doping a substrate, comprising:
    disposing a coating of a composition comprising a dopant-containing polymer and a non-polar solvent on a substrate; and
    annealing the substrate at a temperature of 750 to 1300° C. for 1 second to 24 hours to diffuse the dopant into the substrate;
    wherein the dopant-containing polymer is a polymer having a covalently bound dopant atom; wherein the dopant-containing polymer is free of nitrogen and silicon; and wherein the method is free of a step of forming an oxide capping layer over the coating prior to the annealing step.

2. The method of claim 1 wherein the dopant is chosen from boron, phosphorus, arsenic, bismuth, antimony, and gallium.

3. The method of claim 1 wherein the substrate is a semiconducting substrate.

4. The method of claim 3 wherein the substrate comprises one or more of silicon, gallium and germanium.

5. The method of claim 1 wherein a single annealing step is performed.

6. The method of claim 1 wherein the dopant is diffused into the substrate to a depth of ≤10 nm.

7. The method of claim 1 wherein the non-polar solvent has a dielectric constant (∈) of ≤17.5.

8. The method of claim 1 wherein the polymer comprises <50 wt % of a monomer comprising a substituent chosen from hydroxyl, amine, amido, thiol, carboxylic acid, and combinations thereof.

9. The method of claim 1 wherein the annealing step is performed in an oxygen-containing atmosphere.

* * * * *